United States Patent [19]
Saito et al.

[11] Patent Number: 4,734,340
[45] Date of Patent: Mar. 29, 1988

[54] DIELECTRIC THIN FILM

[75] Inventors: Masaki Saito; Toshio Mori, both of Kanagawa, Japan

[73] Assignee: Sony Corporation, Tokyo, Japan

[21] Appl. No.: 885,020

[22] Filed: Jul. 14, 1986

[30] Foreign Application Priority Data

Jul. 16, 1985 [JP] Japan ................................ 60-156519

[51] Int. Cl.$^4$ .......................... B32B 19/00; B32B 9/00
[52] U.S. Cl. ...................................... 428/698; 361/22; 428/698; 427/34
[58] Field of Search ............... 428/698, 699, 469, 701; 361/322; 427/34

[56] References Cited

U.S. PATENT DOCUMENTS

| 2,899,345 | 8/1959 | Oshy ......................... 361/322 X |
| 2,960,642 | 11/1960 | Rudnay ......................... 361/322 |
| 3,320,500 | 5/1967 | Axelrod et al. ............... 361/322 X |

FOREIGN PATENT DOCUMENTS 907020  9/1962  United Kingdom ............... 361/322

Primary Examiner—Nancy A. B. Swisher
Attorney, Agent, or Firm—Hill, Van Santen, Steadman & Simpson

[57] ABSTRACT

A high dielectric constant capacitor comprising a thin film deposited on a substrate, the thin film being composed of a mixture of a tantalum oxide and a titanium oxide wherein the ratio of Ti to Ta is in the range from 0.1 to 4 atomic percent.

6 Claims, 11 Drawing Figures

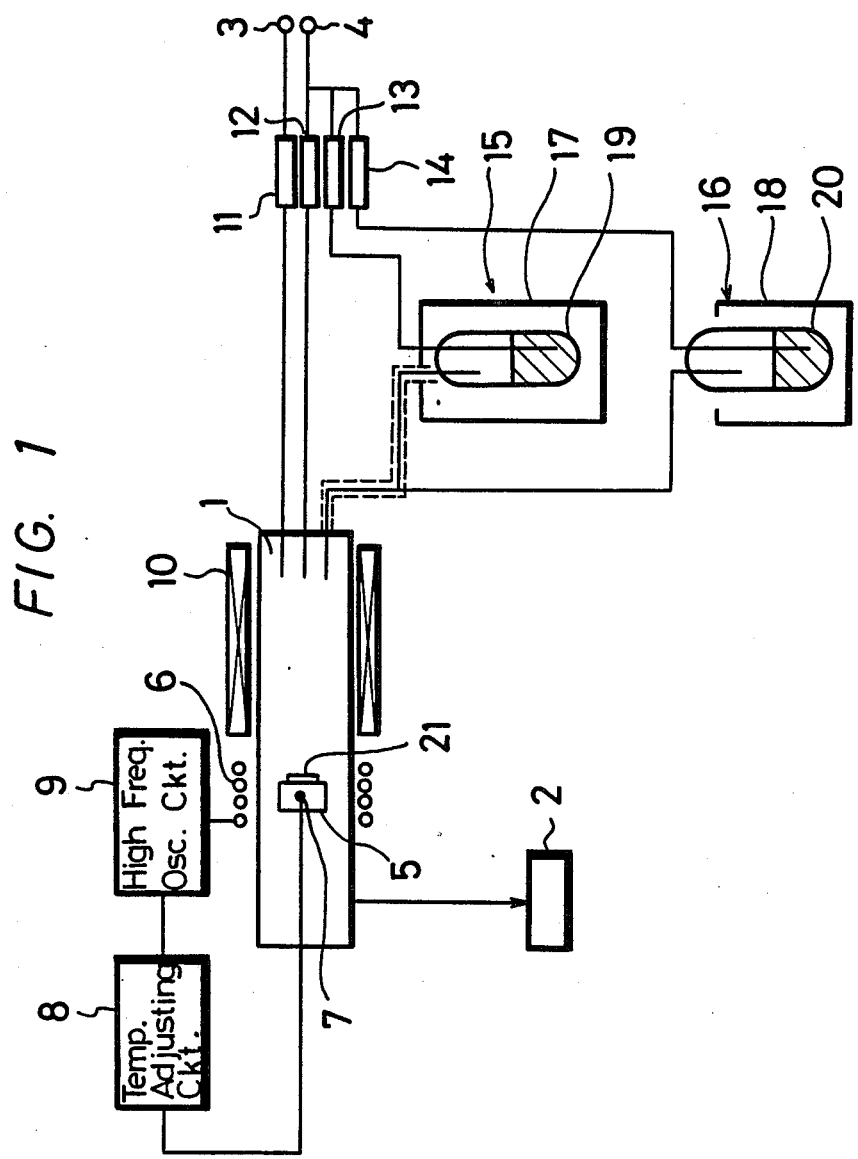

FIG. 4A  Ti/Ta=0
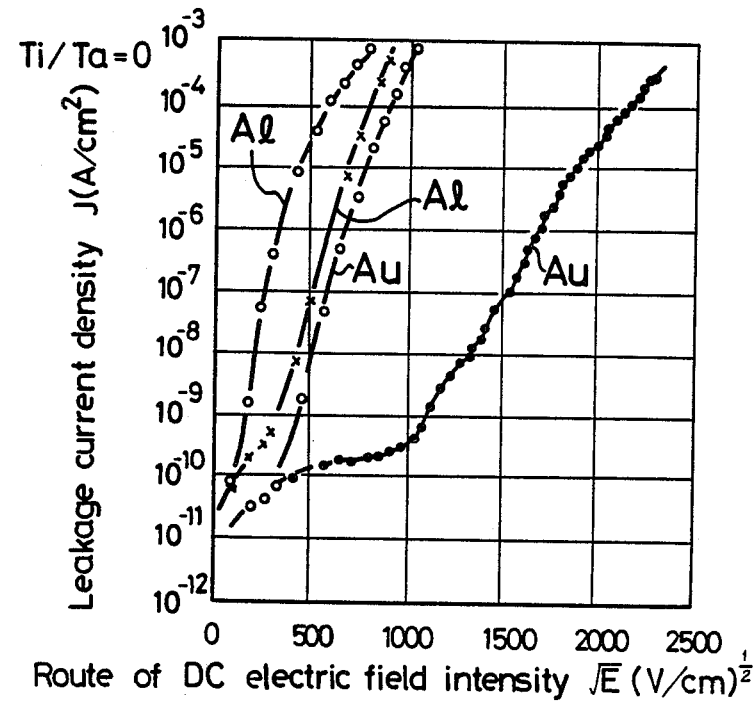
FIG. 4B
Ti/Ta = 1.9 at%
—o—o— Au(+)
—•—•— Au(−)
—x—x— Aℓ(+)
—o—o— Aℓ(−)
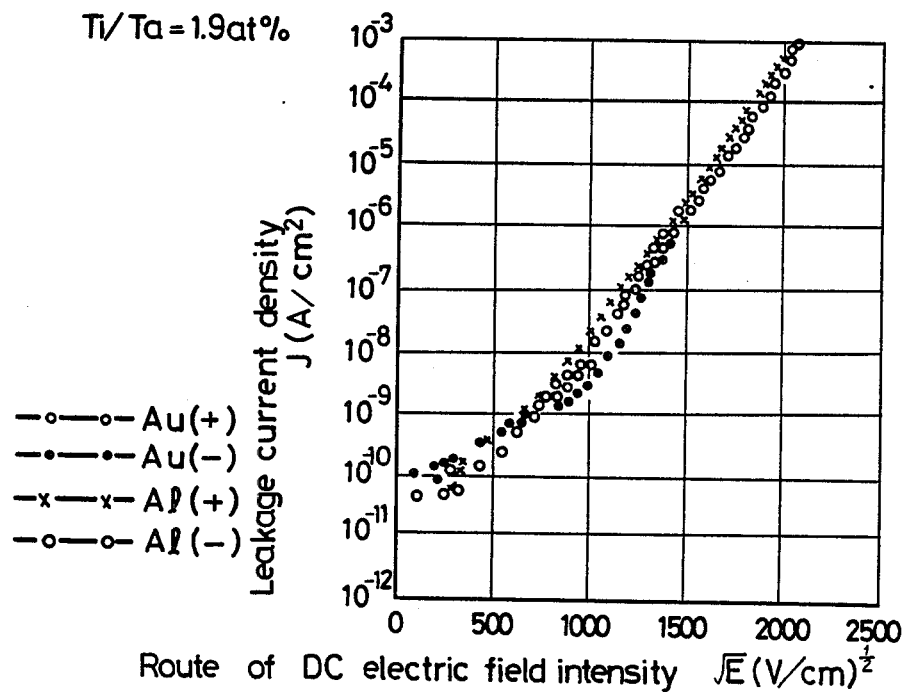

DIELECTRIC THIN FILM

BACKGROUND OF THE INVENTION

1. Field of the Invention

The present invention relates to the production of high dielectric constant thin films, and is particularly directed to a thin film having a high dielectric constant and high dielectric strength for use as a dielectric material in a capacitor or the like.

2. Description of the Prior Art

The thin film composed of tantalum oxide ($Ta_2O_5$) and formed by chemical vapor deposition by the oxygen-assisted thermal decomposition of tantalum ethylate ($Ta(OC_2H_5)$) has a relative dielectric constant of about 25 to 28 which is higher than that of a thin film made of $SiO_2$, $Si_3N_4$, or the like and advantageously may be employed for miniaturizing a capacitive element and for improving the degree of integration of an integrated circuit. For comparison, the relative dielectric constant of $SiO_2$ is about 3.7 and that of $Si_3N_4$ is about 7.

As methods for forming a thin film of $Ta_2O_5$, are included a sputtering method, a chemical vapor deposition method, and an anodic oxidation method for Ta film. Of these methods, the chemical vapor deposition method is superior to other methods in its adaptability to mass production.

Although the $Ta_2O_5$ thin film can be mass produced by the chemical vapor deposition method as described above, if the film thickness of the $Ta_2O_5$ film is less than 500 Å, a dimension which is commonly used in practice, the insulating property is poor, that is, its dielectric strength is low. Thus, a $Ta_2O_5$ thin film having very low film thicknesses cannot presently be used in practice.

When a $Ta_2O_5$ thin film formed by chemical vapor deposition is used as a capacitive element, noble metals such as gold and platinum and the like can be used as the electrodes on both surfaces of this film, and high insulating properties and high dielectric strengths can be obtained. On the other hand, if metals and semiconductors such as aluminum, chromium, silicon and the like are used as electrodes, there arises the problem that the insulating property is deteriorated.

SUMMARY OF THE INVENTION

The present invention provides an improved high dielectric constant thin film which has excellent insulating properties and dielectric strength. The present invention is particularly directed to providing a thin film with a high dielectric constant which can be used in a capacitor of miniature size. The high dielectric constant properties of the thin film make it possible to improve the integration degree of an integrated circuit in which the capacitive element is included.

In accordance with the present invention, there is provided a high dielectric constant thin film on a substrate, the thin film being a mixture of a tantalum oxide and a titanium oxide. The film is formed on the substrate preferably by a chemical vapor deposition method in such a manner that the ratio of Ti to Ta is in the range from 0.1 to 4 atomic percent.

Other objects, features and advantages of the present invention will become apparent from the following detailed description of a preferred embodiment taken in conjunction with the accompanying drawings.

BRIEF DESCRIPTION OF THE DRAWINGS

FIG. 1 is a diagrammatic showing of an example of apparatus for manufacturing a high dielectric constant thin film according to the present invention;

FIGS. 4A to 4C are graphs showing the relationship between electric field and leakage current using various types of electrodes;

DESCRIPTION OF THE PREFERRED EMBODIMENTS

Figure 2A:
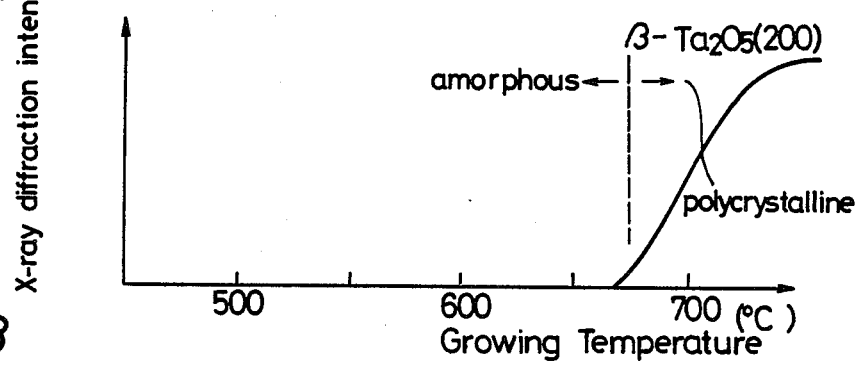
FIGS. 2A to 2C are graphs illustrating the relationships between the X-ray diffraction intensity (2A); refractive index (2B) and dielectric strength of the thin film (2C) plotted against the growth temperature of the thin film.

A specific embodiment of a high dielectric constant thin film according to the present invention will be described in detail with reference to the accompanying drawings.

An embodiment of the high dielectric constant thin film of the present invention will be described with reference to a method for manufacturing the film. In FIG. 1, there is shown a schematic diagram employing an apparatus used in the manufacturing method. In FIG. 1, reference numeral 1 designates a reaction chamber, the inside of which is held at a substantial vacuum by means of a vacuum pump 2. Into the reaction chamber 1 there is supplied oxygen gas from an oxidizing gas source 3 and a carrier gas such as Ar or He from a carrier gas source 4. These gases flow through first and second flow rate control valves 11 and 12, respectively. Similarly, the carrier gas from the carrier gas source 4 is supplied through third and fourth flow rate control valves 13 and 14 to first and second bubblers 15 and 16. The resulting vapors are supplied into the aforementioned reaction chamber 1. Constant temperature baths 17 and 18 surround the first and second bubblers 15 and 16. Reference numerals 19 and 20 are applied to first and second cylinders used for bubbling.

A tantalum alkoxide, for example, tantalum penta-ethylate $Ta(OC_2H_5)_5$ having a purity of 99.9999% is contained in the first cylinder 19 and is heated therein while a titanium alkoxide such as $Ti(isoOC_3H_7)_4$ having a purity of 99.999% is contained in the second cylinder 20 and is heated therein.

A susceptor 5 made of graphite is located within the reaction chamber 1 and is heated by means of a high frequency induction coil 6 located outside the reaction chamber 1. The temperature existing is detected by a thermal sensor 7 and a thermal regulating circuit 8 receives the signal from the sensor 7 and controls the current passing from a high frequency oscillation circuit 9 to the coil 6. The temperature at the susceptor 5 is thereby controlled to reach a desired value.

Reference numeral 21 designates a substrate mounted on the susceptor 5. A preheater 10 is used to heat the reaction chamber 1 at a portion near the entrance through which the abovementioned gases are supplied.

The above-mentioned apparatus may be operated under the following conditions.

| | |
|---|---|
| Pressure within the reaction chamber 1 | 0.3 Torr |
| Flow rate at first flow rate control valve 11 | 100 SCCM |
| Flow rate at second flow rate control of valve 12 | 500 SCCM |
| Flow rate at third flow rate control valve 13 | 150 SCCM |
| Flow rate at third flow rate control valve 14 | 50 SCCM |
| Temperature of first bubbler 15 | 125° C. |
| Temperature of second bubbler 16 | 20° C. |
| Temperature of pre-heater 10 | 250° C. |
| Temperature of susceptor 5 | 620° C. |

The temperature of the supply tube from the first bubbler 15 to the reaction chamber 1 was kept at 170° C.

While $Ta(OC_2H_5)_5$ within the first bubbler 15 is liquid at a room temperature to about 200° C., it is evaporated at 125° C. under an atmospheric pressure of 0.3 Torr. The feeding rate to the reaction chamber 1 is controlled by the flow rate of the carrier gas through the third flow rate control valve 13. The flow rate of the Ta-$(OC_2H_5)_5$ vapor evaporated from the bubbler 15 is kept at a predetermined temperature such as to prevent the vapor from being condensed again.

The $Ti(isoOC_3H_7)_4$ within the second bubbler 16 is evaporated at 20° C. under the same reduced pressure and, similarly, the flow rate of vapor into the reaction chamber 1 is controlled by the flow rate of the carrier gas through the fourth flow control rate valve 14.

Under the conditions described above, the reaction for deposition was carried out for six minutes to thereby form a $Ta_2O_5$ thin film having a thickness of about 1000 Å on the substrate 21.

Figure 2B:
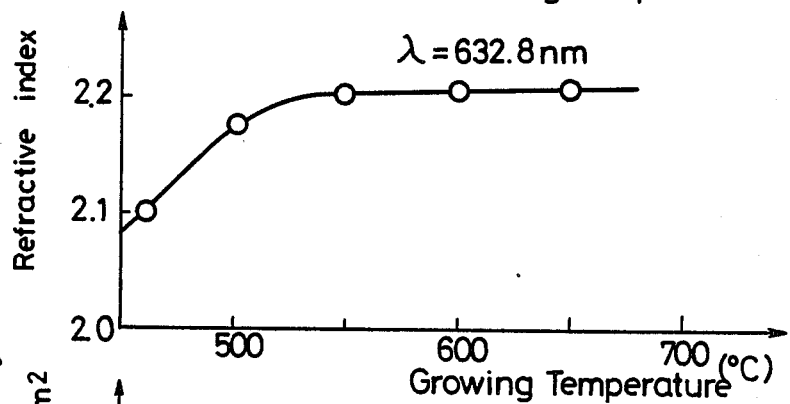
Figure 2C:
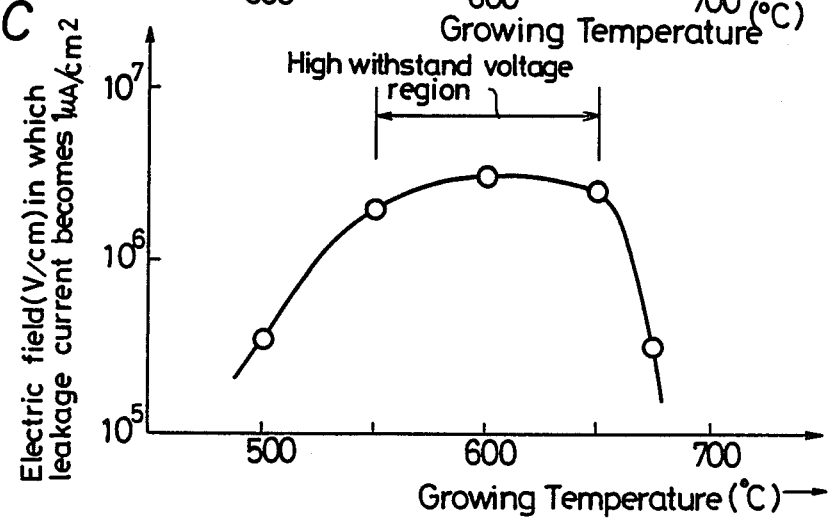

FIGS. 2A, 2B and 2C are graphs showing the effect of changing the temperature of the substrate 21, the temperature being indicated on the abscissa. The X-ray diffraction intensity is indicated in FIG. 2A, and the refractive index in FIG. 2B. The electric field (V/cm) in which the leakage current becomes 1 $\mu A/cm^2$ is indicated in FIG. 2C on the ordinates thereof.

As seen from FIG. 2, the $Ta_2O_5$ having a high dielectric strength was obtained when the growing temperature, that is, the temperature of the substrate, was in the range from 550° C. to 650° C., indicated by the double arrowed line in FIG. 2C, and preferably in the range from 600° C. to 650° C.

The reason that the dielectric strength of the film is reduced at tempertures in excess of 650° C., as seen from X-ray diffraction, is that a polycrystalline portion is produced in the grown thin film so that the structure of the thin film is not homogeneous. Furthermore, the dielectric strength is deteriorated at temperatures below about 550° C., as indicated by the decrease of the refractive index of the grown thin film, only a thin film having a low density is formed because the grown thin film has porous portions therein or unreacted material mixed therein.

As will be understood from the foregoing results, it was confirmed that in order to obtain a $Ta_2O_5$ thin film having a high dielectric strength, the film must be grown at a temperature as high as possible in the range in which an amorphous film can be obtained. After the film was grown at a substrate temperature of 620° C. for two minutes, a $Ta_2O_5$ thin film having a film thickness of about 200 Å was obtained. When a Pt electrode having an area of 1 $mm^2$ was formed on the resulting thin film mentioned above, a capacity of 0.0116 $\mu F$ and having a value of tan $\delta$ of 0.5% was obtained. The dielectric breakdown voltage was 6.0 V.

It will be understood that if the growing temperature is properly selected, a $Ta_2O_5$ thin film having a high dielectric strength is obtained. As mentioned previously, it is known that if the noble metals, such as Au, Pt and the like are used as electrodes deposited on both surface so this thin film, high insulating properties are obtained whereas if other metals and semiconductors such, for example, as Al, Cr, Si and the like are used, the insulating property is deteriorated.

Figure 3:
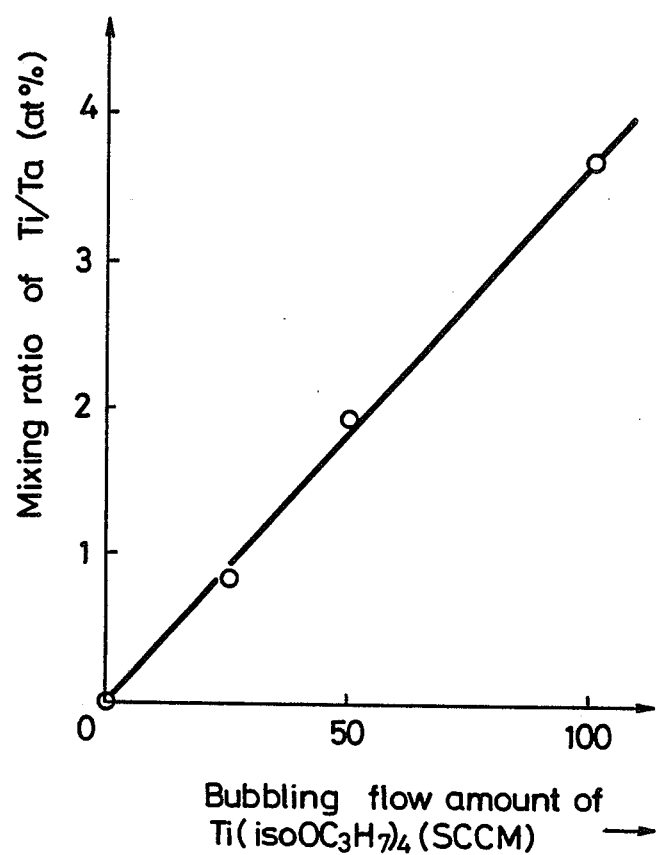
FIG. 3 is a graph showing the ratio between the flow rate of the titanium alkoxide used in the synthesis and the Ti/Ta ratio in the thin film.

In accordance with the present invention as shown in FIG. 1, there is provided a second bubbler 16 by means of which vapors of $Ti(isoOC_3H_7)_4$ are supplied into the reaction chamber 1. A thin film thus obtained was measured by the ICP emission spectrochemical analysis to determine the atomic ratio of Ti/Ta and it was confirmed that a proportional relationship is established between the flow rate through the fourth flow rate control valve 14 and the added amount as shown in FIG. 3. It was also confirmed that if the temperature of the second bubbler 16 is changed, the resulting concentration is also changed.

Figure 4C:
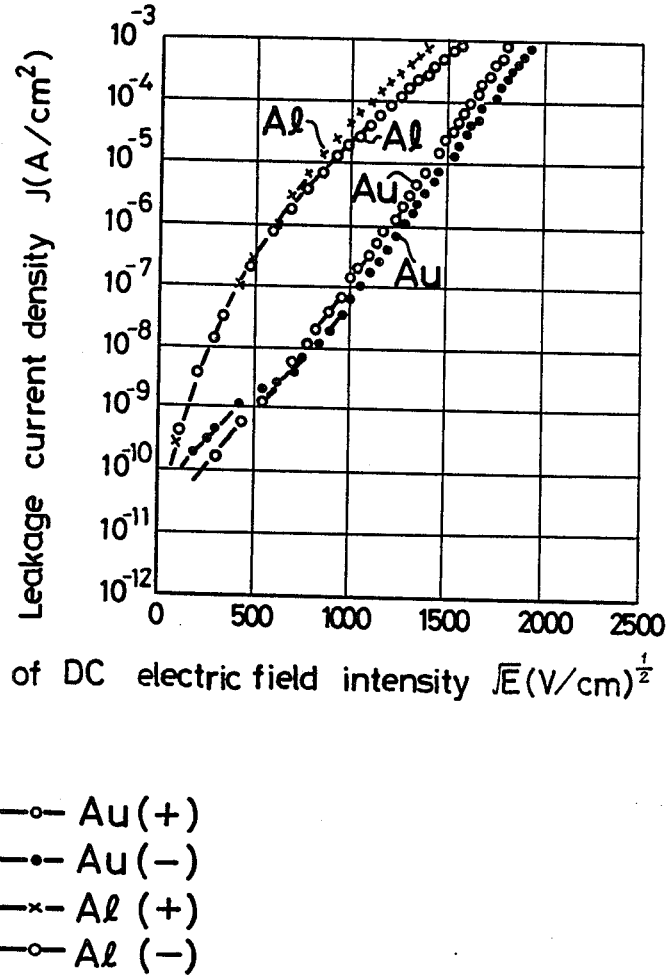

The relationship between a DC electric field intensity E of the thin film and the leakage current density J was measured at three concentration ratios of Ti/Ta, with different electrode materials, and with different electrode polarities. The measured results are indicated on FIGS. 4A to 4C. FIG. 4A illustrates the instance where Ti/Ta=0, FIG. 4B shows the case where Ti/Ta is 1.9 atomic percent and FIG. 4C illustrates the case where Ti/Ta is 3.7 atomic percent. Au and Al were used as the electrode materials and the respective polarities thereof are indicated as plus (+) and minus (−), respectively.

As the electrode on the substrate side, there was used an Si substrate of the n-type, the resistivity of which was 0.02 ohm-cm, and a $Ta(OC_2H_5)_5$ thin film was formed in its (111) plane. In FIGS. 4A through 4C, the square root of the DC electric field E is plotted on the abscissa, while the leakage current density J is plotted logarithmically on the ordinate.

When the ratio Ti/Ta is zero, largely different characteristics are obtained dependent on the material of the electrodes and the polarity of the electric field applied. Particularly, when using the structure Al—$Ta_2O_5$—Si which is frequently used as a capacitor, a high dielectric strength could not be obtained and so the structure could not be used effectively.

FIG. 4B illustrates the case in which Ti/Ta is adjusted to 1.9 atomic percent. From this Figure, it will be clear that it is possible to obtain a capacitance which is not substantially affected by the material of the electrodes and the polarity of the DC electric field and which has a high dielectric strength as a whole. The fact that aluminum can be used instead of gold is also a substantial advantage in practice.

FIG. 4C illustrates the situation in which the Ti/Ta ratio is about 3.7 atomic percent. In this Example, it will be seen that the leakage current is increased, particularly in the case of the Al electrode.

Figure 5:
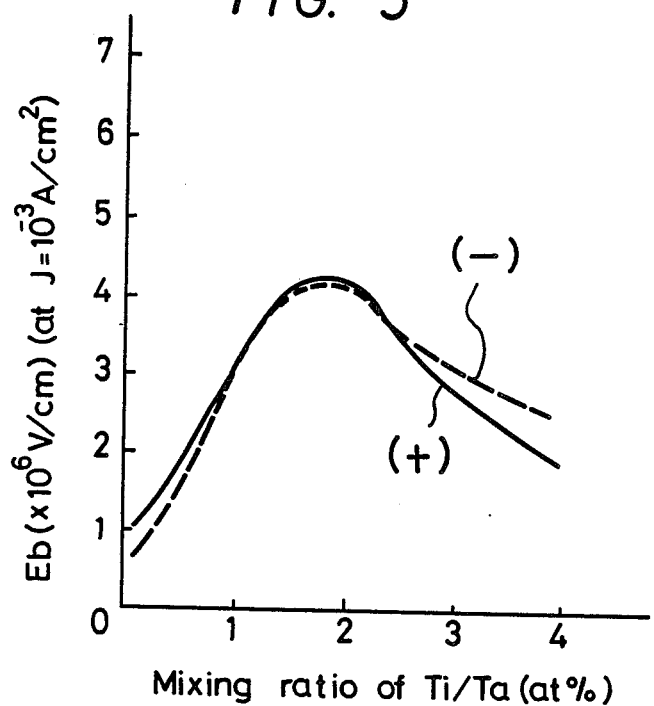
FIG. 5 is a graph showing the relationship between the Ti/Ta ratio in the thin film and its dielectric strength.

FIG. 5 is a graph plotting the Ti/Ta ratio on the abscissa and the electric field intensity Eb on the ordinate. This graph shows measured results of the change in the electric field intensity when the leakage current density J becomes $1 \times 10^{-3}$ A/cm$^2$ in relation to the ratio of Ti/Ta. From FIG. 5 it will be seen that for a practical dielectric strength of $2 \times 10^6$ V/cm, the atomic ratio should be greater than 0.5 and less than 3 atomic percent.

Figure 6:
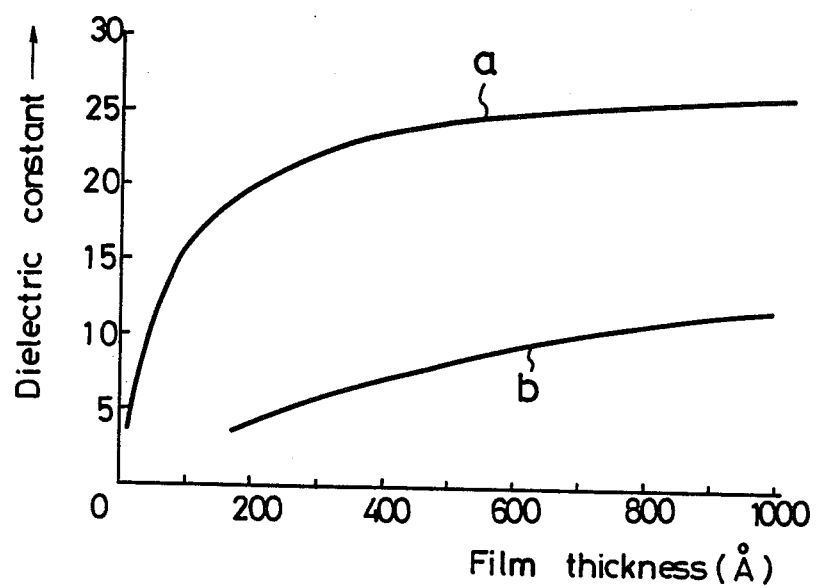
FIG. 6 is a graph showing the relationship between the film thickness and the dielectric constant.

As noted previously, a $Ta_2O_5$ thin film can be produced by a sputtering method. FIG. 6 is a graph showing the relationship between the average dielectric constant with respect to a thin film made by sputtering and a thin film made by the present invention. In the graph of FIG. 6, the curve a indicates the measured results of the thin film made by the present invention, while curve b indicates the results obtained from a thin film made by the sputtering method.

It will be seen from FIG. 6 that the dielectric constant of a thin film made by the sputtering method is considerably lower as compared with that made by the present invention. The reason for this is that in the sputtering method there is produced a layer having a film thickness of about 170 Å and a low dielectric constant and which may consist of $SiO_2$. In accordance with the chemical vapor deposition method of this invention, however, there is almost no layer having a low dielectric constant so that an overall high dielectric constant is obtained. In the graph of FIG. 6, the curve a indicates the calculated value in the case where an $SiO_2$ film or layer having a film thickness of about 12 Å is assumed to be produced.

Figure 7:
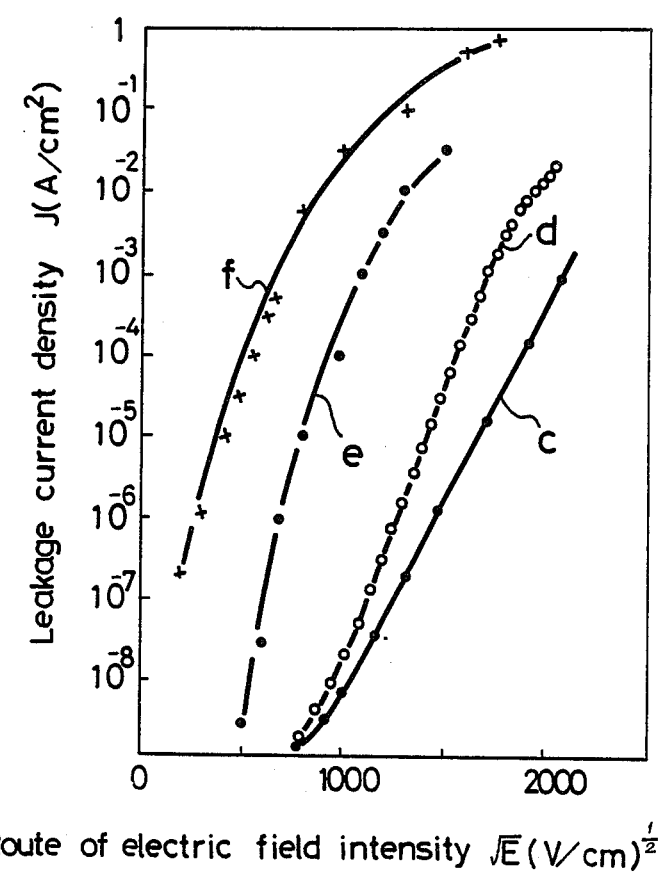
FIG. 7 is a graph showing the relationship between electric field intensity and leakage current.

FIG. 7 shows the relationship between the square root of the DC electric field E and the leakage current density J with respect to the thin film of the present invention and films produced by other methods. In the graph of FIG. 7, curve c indicates the measured results of the thin film made by the present invention, curve d indicates the results of a thin film produced by a magnetron sputtering method, curve e indicates the results obtained from a thin film made by a thermal oxidation method of Ta and curve f indicates the results obtained form a thin film made by another CVD method. From curves c through f, it was confirmed that the thin film of the present invention has a higher dielectric strength as compared with films made by other methods.

As described above, the high dielectric thin film of the present invention has a high dielectric constant and becomes a so-called MIS (metal insulator semiconductor) capacitor having a high dielectric strength. Therefore, the capacitor can be miniaturized and the high dielectric constant thin film of the present invention serves to improve the so-called integration degree of integrated circuits and the like.

The above description is based on a single preferred embodiment of the invention but it will be apparent that many modifications and variations can be effected by one skilled in the art without departing from the spirit or scope of the novel concepts of the invention so that the scope of the invention should be determined by the appended claims only.

We claim as our invention:

1. A high dielectric constant capacitor comprising a substrate and a thin film formed on said substrate said thin film consisting essentially of a mixture of a tantalum oxide and a titanium oxide in which the ratio of Ti to Ta is in the range from 0.1 to 4 atomic percent, said thin film being produced by chemical vapor deposition and decomposition of a tantalum alkoxide and a titanium alkoxide.

2. A high dielectric constant capacitor according to claim 1, wherein said chemical vapor deposition includes the step of an oxygen-assisted pyrolysis of a tantalum alkoxide and a titanium alkoxide.

3. A high dielectric constant capacitor according to claim 2, wherein said tantalum alkoxide is tantalum pentaethylate and said titanium alkoxide is titanium tetraisopropylate.

4. The method of forming a high dielectric constant capacitor which comprises depositing on a substrate a thin film of a tantalum oxide and a titanium oxide by chemical vapor deposition, said thin film having a ratio of Ti to Ta in the range from 0.1 to 4 atomic percent.

5. A method according to claim 4 wherein said chemical vapor deposition includes the step of oxygen-assisted pyrolysis of a tantalum alkoxide and a titanium alkoxide.

6. A method according to claim 5 in which said tantalum alkoxide is tantalum pentaethylate and said titanium alkoxide is titanium tetra isopropylate.

* * * * *